(12) United States Patent
Biery et al.

(10) Patent No.: US 7,273,777 B2
(45) Date of Patent: Sep. 25, 2007

(54) FORMATION OF FULLY SILICIDED (FUSI) GATE USING A DUAL SILICIDE PROCESS

(75) Inventors: Glenn A. Biery, Staatsburg, NY (US); Ghavam Shahidi, Pound Ridge, NY (US); Michelle L. Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 11/195,994

(22) Filed: Aug. 2, 2005

(65) Prior Publication Data

US 2007/0032010 A1 Feb. 8, 2007

(51) Int. Cl.
*H01L 21/8238* (2006.01)
*H01L 21/4763* (2006.01)

(52) U.S. Cl. .................. 438/230; 438/299; 438/630; 438/651; 438/682

(58) Field of Classification Search ............... 438/230, 438/299, 630, 649, 651, 655, 682, 628
See application file for complete search history.

(56) References Cited

U.S. PATENT DOCUMENTS 6,929,992 B1 * 8/2005 Djomehri et al. ........... 438/199

2006/0134844 A1 * 6/2006 Lu et al. ..................... 438/199

* cited by examiner

*Primary Examiner*—Hsien-Ming Lee
(74) *Attorney, Agent, or Firm*—Scully, Scott, Murphy & Presser, P.C.; Robert M. Trepp, Esq.

(57) ABSTRACT

A method for forming a semiconductor device structure, comprising the steps of independently forming source/drain surface metal silicide layers and a fully silicided metal gate in a polysilicon gate stack. Specifically, one or more sets of spacer structures are provided along sidewalls of the polysilicon gate stack after formation of the source/drain surface metal silicide layers and before formation of the silicided metal gate, in order to prevent formation of additional metal silicide structures in the source/drain regions during the gate salicidation process. The resulting semiconductor device structure includes a fully silicide metal gate that either comprises a different metal silicide material from that in the source/drain surface metal silicide layers, or has a thickness that is larger than that of the source/drain surface metal silicide layers. The source/drain regions of the semiconductor device structure are devoid of other metal silicide structures besides the surface metal silicide layers.

15 Claims, 8 Drawing Sheets

FORMATION OF FULLY SILICIDED (FUSI) GATE USING A DUAL SILICIDE PROCESS

RELATED APPLICATIONS

This application is related to co-pending and co-assigned U.S. application Ser. No. 10/885,462, filed Jul. 6, 2004 and U.S. application Ser. No. 10/890,753, filed Jul. 14, 2004, the entire contents of which are both incorporated herein by reference.

FIELD OF THE INVENTION

The present invention relates to a semiconductor device and a method of fabricating the same, and more particularly to a metal oxide semiconductor (MOS) device that includes an advanced gate structure, e.g., fully silicided metal gate, as well as a method of fabricating the fully silicided metal gate device.

BACKGROUND OF THE INVENTION

Throughout the prior art, metal gate integration has proven difficult to achieve in a conventional process flow for MOS transistors. Most metal gate materials interact with the gate dielectric during the high temperature processing needed for source/drain (S/D) junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process complexity and cost increases.

It is known in the prior art to form self-aligned silicided metal gates by reacting polycrystalline silicon with a metal. For example, the prior art process begins with providing a precursor structure that includes a semiconductor substrate having one or more patterned gate regions separated from each other by one or more isolation regions, each gate region containing at least a gate dielectric and a polysilicon gate conductor. Dielectric cap and spacer structures can be respectively formed on top of and along sidewalls of each gate region as well. Subsequently, source/drain implants are performed to form source and drain regions, during which the polysilicon gate conductor is protected by the dielectric cap and spacer. Next, the dielectric cap is non-selectively removed from the top of each gate region, and then a silicide metal, such as Ni or Co, is deposited on the entire structure. An optional oxygen diffusion barrier layer can be formed atop the silicide metal, and then annealing is performed to cause reaction between the polysilicon and the silicide metal in both the gate region and the source and drain regions. Depending on the metal, a low resistivity metal silicide can be formed by utilizing a single annealing step. After the single anneal, any unreacted metal and the optional oxygen diffusion barrier is removed, and if needed, a second annealing step may be performed to form a low resistivity metal silicide. In such a manner, the salicidation process described above simultaneously forms a fully silicided metal gate and metal silicide surface layers in the source/drain regions.

This prior art process does not allow independent salicidation of the gate region and the source/drain regions, and it can only form metal silicide gates and source/drain surface metal silicide layers of approximately the same thickness, i.e., about 100 nm. However, the gate region and the source/drain regions typically have significantly different silicide requirements. Specifically, the source/drain surface metal silicide layers should be relatively thin (e.g., about 20 nm) to prevent source/drain punchthrough, while the metal silicide gate is typically much thicker.

Therefore, the thick source/drain surface metal silicide layers formed by the above described prior art process can be problematic for a few reasons. First, the silicide can extend underneath the gate region, thereby shorting the device. Secondly, the thick source/drain metal silicide can also be problematic given the recess of the isolation regions of the device caused by the non-selective removal of the dielectric cap from the gate region. Specifically, the silicide in the prior art process can short across devices separated by narrow isolation regions. Thirdly, the thick silicide may consume the silicon in the extension regions under the spacers leading to poor device performance.

Hence, there is a continuing need for improved methods that produce a thick and fully silicided metal gate and a much thinner source/drain silicide.

SUMMARY OF THE INVENTION

In one aspect, the present invention relates to a method for forming a semiconductor device structure having a fully silicide metal gate, comprising:

providing a precursor structure that comprises at least one patterned gate stack with an overlaying dielectric mask and a first set of sidewall spacer structures, and abutting source and drain regions with surface metal silicide layers, wherein at least one patterned gate stack comprises a polysilicon gate conductor on a gate dielectric layer;

forming one or more additional sets of spacer structures alongside of the first set of sidewall spacer structures;

removing the overlaying dielectric mask to expose the polysilicon gate conductor; and converting the polysilicon gate conductor into a fully silicided metal gate.

The method of the present invention provides independent fabrication of the source/drain surface metal silicide layers and the fully silicided metal gate and thereby allows the source/drain surface metal silicide layers and the fully silicided metal gate to contain different metal silicide materials and/or have different thickness, depending on the requirements of specific applications. More importantly, the one or more additional sets of spacer structures, which are provided after formation of the source/drain surface metal silicide layers and before formation of the fully silicided metal gate, effectively prevent formation of additional, undesirable metal silicide structures (e.g., metal silicide "spikes" under the first set of sidewall spacer structures) in the source and drain regions during the gate salicidation process.

Preferably, the present invention provides a semiconductor device structure that comprises a fully silicided metal gate of a first thickness and abutting silicided source and drain regions with surface metal silicide layers of a second thickness, wherein the second thickness is less than the first thickness. More preferably, the first thickness is greater than 500 Å, and the second thickness is less than 500 Å or 300 Å.

In accordance with the present invention, the fully silicided metal gate and the source/drain surface metal silicide layers can be composed of the same or different metal silicide material(s), such as silicides of Ti, Ta, W, Co, Ni, Pt, Pd, Re, Ru, Ge and alloys thereof. Of the various silicides, silicides of Co, Ni or Pt, in their lowest resistivty phase, are particularly preferred. In a highly preferred embodiment of the present invention, the source/drain surface metal silicide layers include $CoSi_2$, while the silicided metal gate includes NiSi or NiPtSi.

In another aspect, the present invention relates to a method for forming a semiconductor device structure having a fully silicide metal gate and abutting source and drain regions with surface metal silicide layers, comprising a first salicidation step for forming the surface metal silicide layers in the source and drain regions, and a second salicidation step for converting a polysilicon gate conductor in a patterned gate stack into the fully silicide metal gate, wherein one or more sets of spacer structures are formed along sidewalls of the patterned gate stack after the first salicidation step and before the second salicidation step.

In a further aspect, the present invention relates to a semiconductor device structure that comprises a fully silicided metal gate of a first thickness and abutting source and drain regions with surface metal silicide layers of a second thickness, wherein the second thickness is less than the first thickness, and wherein the abutting source and drain regions are devoid of other metal silicide structures besides the surface metal silicide layers.

In still another aspect, the present invention relates to a semiconductor device structure comprising a fully silicided metal gate of a first silicide metal, and abutting source and drain regions containing surface metal silicide layers of a second, different silicide metal, wherein the abutting source and drain regions are substantially free of the first silicide metal.

Other aspects, features and advantages of the invention will be more fully apparent from the ensuing disclosure and appended claims.

DETAILED DESCRIPTION OF THE INVENTION

Figure 1A:
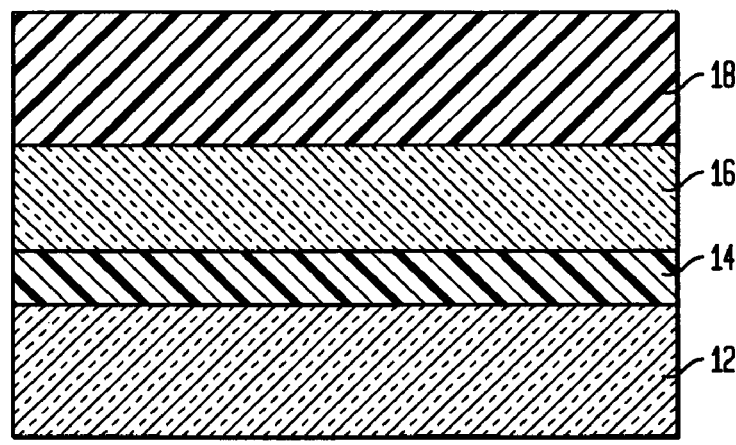
FIGS. 1A-1M illustrates the processing steps for fabricating a MOS device with independently formed silicided metal gate and source/drain surface metal silicide layers, according to one embodiment of the present invention, while the source and drain regions are devoid of other metal silicide structures besides the surface metal silicide layers.

In the following description, numerous specific details are set forth, such as particular structures, components, materials, dimensions, processing steps and techniques, in order to provide a thorough understanding of the invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a method for independently forming the silicided metal gate and the surface metal silicide layers in the abutting source and drain regions, so as to achieve desired silicide thickness and/or composition in the gate region and the source/drain regions of the MOS device structure. This is especially important as device scaling forces gate dimensions to asymptotically approach the lower limit. Independent control of the gate and source/drain salicidation processes is therefore critical in all advanced device structures.

The present invention, which provides a method for fabricating a MOS device structure that has a thick fully silicided gate and relatively thin surface metal silicide layers in abutting source and drain regions, as well as the resulting MOS device structure, will now be described in greater detail by referring to FIGS. 1A-1M, which accompany the present application. In the accompanying drawings, which are not drawn to scale, like and/or corresponding elements are referred to by like reference numerals. It is noted that in the drawings only one MOS device region is shown atop a single semiconductor substrate. Although illustration is made to such an embodiment, the present invention is not limited to the formation of any specific number of MOS devices on the surface of the semiconductor structure.

Reference is first made to FIG. 1A, which shows a semiconductor substrate 12. The semiconductor substrate 12 may comprise any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region (not shown). For clarity, the doped regions are not specifically labeled in the drawings of the present application. The first doped region and the second doped region may be the same, or they may have different conductivities and/or doping concentrations. These doped regions are known as "wells".

Preferably, at least one isolation region (not shown) is typically formed into the semiconductor substrate 12. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions (not shown). The neighboring gate regions can have the same conductivity (i.e., both n- or p-type), or alternatively they can have different conductivities (i.e., one n-type and the other p-type). Alternatively, butted junctions may be formed wherein the neighboring gate regions abut one another and are not separated by any isolation regions.

After forming at least one isolation region within the semiconductor substrate 12, a gate dielectric layer (not shown) is formed on the entire surface of the structure. The gate dielectric layer can be formed by a thermal growing process such as, for example, oxidation, nitridation or oxynitridation. Alternatively, the gate dielectric layer can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer may also be formed utilizing any combination of the above processes.

The gate dielectric layer is comprised of an insulating material including, but not limited to: an oxide, nitride, oxynitride and/or silicate including metal silicates and nitrided metal silicates. In one embodiment, it is preferred that the gate dielectric layer is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric layer may vary, but typically, the gate dielectric layer has a thickness from about 0.5 to about 10 nm, with a thickness from about 0.5 to about 3 nm being more typical.

After forming the gate dielectric layer, a blanket layer of polysilicon (i.e., poly Si) is formed on the gate dielectric layer, utilizing a known deposition process such as, for example, physical vapor deposition, CVD or evaporation. The blanket layer of polysilicon may be doped or undoped. If doped, an in-situ doping deposition process may be employed in forming the same. Alternatively, a doped poly Si layer can be formed by deposition, ion implantation and annealing. The doping of the poly Si layer will shift the workfunction of the silicided metal gate formed. Illustrative examples of dopant ions include As, P, B, Sb, Bi, In, Al, Ga, Ti or mixtures thereof. Preferable doses for the ion implants are $1E14 (=1 \times 10^{14})$ to $1E16 (=1 \times 10^{16})$ atoms/cm$^2$ or more preferably 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

The gate dielectric layer and the polysilicon layer jointly form the polysilicon gate stack layer 14, as shown in FIG. 1A. Such a polysilicon gate stack layer 14 may comprise additional structure layers, e.g., cap layers and/or diffusion barrier layers, as commonly included in MOS gate structures.

After formation of the polysilicon gate stack layer 14, a dielectric hard mask 16 is deposited over the polysilicon gate stack layer 14 utilizing a deposition process such as, for example, physical vapor deposition or chemical vapor deposition. The dielectric hard mask 16 may be an oxide, nitride, oxynitride or any combination thereof.

Figure 1B:
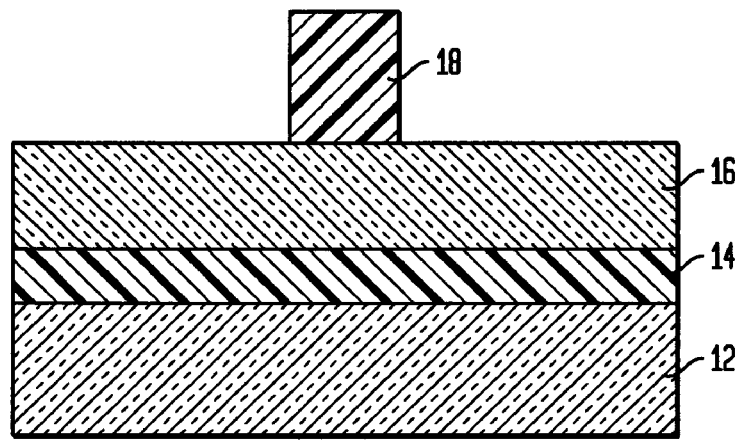
Figure 1C:
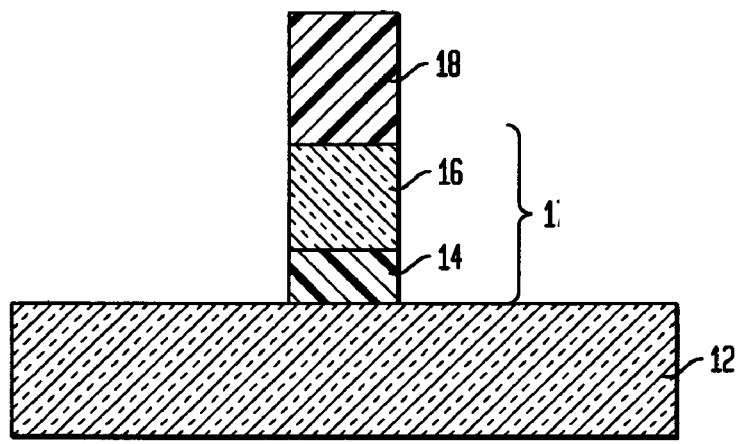

The polysilicon gate stack layer 14 and the dielectric hard mask 16 are then patterned by lithography and etching so as to provide patterned gate stacks. The patterned gate stacks may have the same dimension, i.e., length, or they can have variable dimensions to improve device performance. The lithography step includes applying a photoresist with or without an anti-reflective coating (ARC) layer 18 to the upper surface of the dielectric hard mask layer 16, exposing the photoresist and/or photoresist/ARC layer 18 to a desired pattern of radiation and developing the exposed photoresist utilizing a conventional resist developer. The resultant structure is shown in FIG. 1B. The pattern in the photoresist and/or photoresist ARC layer 18 is then transferred to the dielectric mask layer 16 and the polysilicon gate stack layer 14 utilizing one or more dry etching steps, forming one or more patterned gate stacks 17 as shown in FIG. 1C. In some embodiments, the patterned photoresist and/or photoresist/ARC layer 18 may be removed after the pattern has been transferred into the dielectric mask layer 16. In other embodiments, the patterned photoresist and/or photoresist/ARC layer 18 is removed after etching has been completed.

Suitable dry etching processes that can be used in the present invention in forming the patterned gate stacks 17 include, but are not limited to: reactive ion etching (RIE), ion beam etching, plasma etching or laser ablation.

Figure 1D:
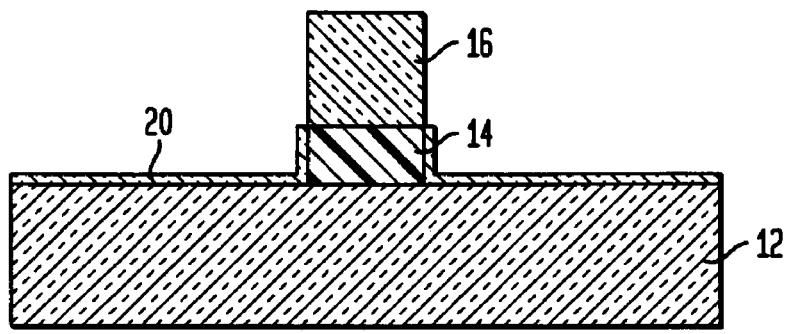
Figure 1E:
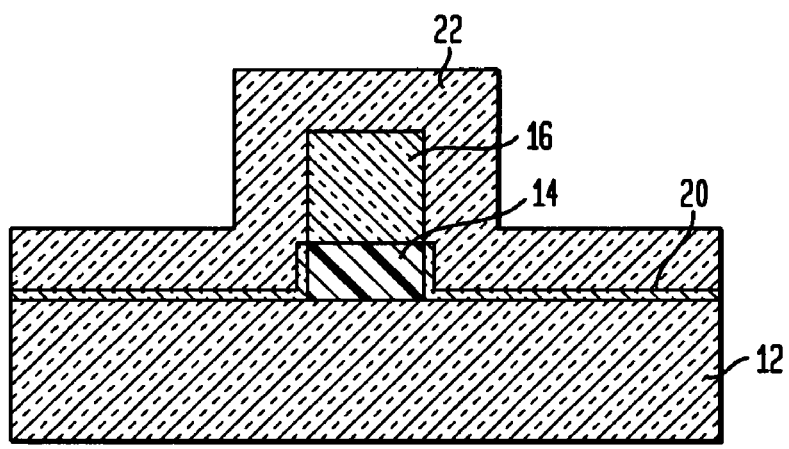
Figure 1F:
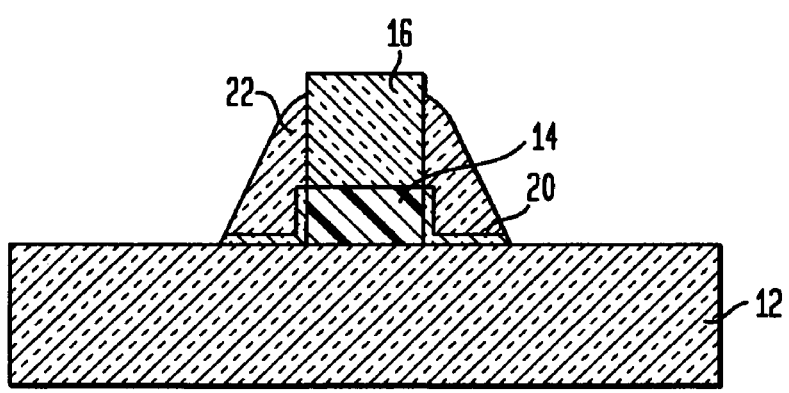

A reoxidation process can optionally, but not necessarily, be performed to create a conformal silicon oxide sidewall layer 20, as shown in FIG. 1D. Note that the layer 20 forms on the horizontal surface of substrate 12 as well. Next, a conformal silicon nitride layer 22 is deposited over the entire structure, as shown in FIG. 1E, which is then patterned to form a first set of sidewall spacers 22 along exposed sidewalls of the patterned gate stack 17, as shown in FIG. 1F. Patterning of the layer 22 is achieved by utilizing an etching process that selectively removes nitride. A second etching step can be performed to expose the surface of the substrate 12. Depending on the technology, the number of spacers may vary. The spacers are designed to optimize the device performance, so depending on the performance targets, complex spacer structures are typically employed.

Figure 1G:
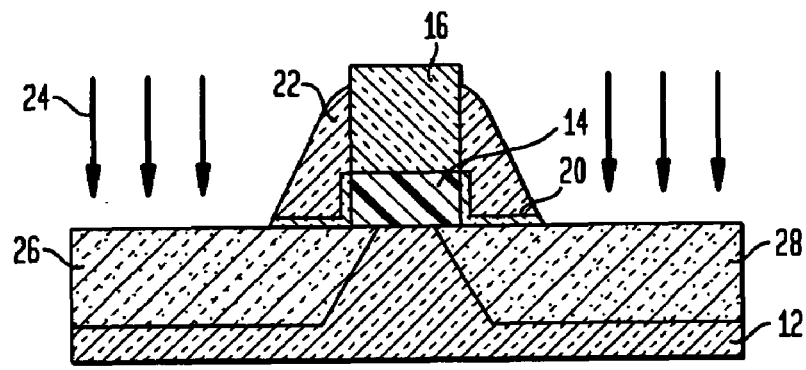

After formation of the first set of spacers 20 and 22, source and drain regions 26 and 28 are formed into the semiconductor substrate 12, by utilizing ion implantation 24 shown in FIG. 1G and a subsequent annealing step (not shown). The annealing step serves to activate the dopants that were implanted by the previous implant step. The conditions for the ion implantation 24 and the annealing step are well known to those skilled in the art.

Figure 1H:
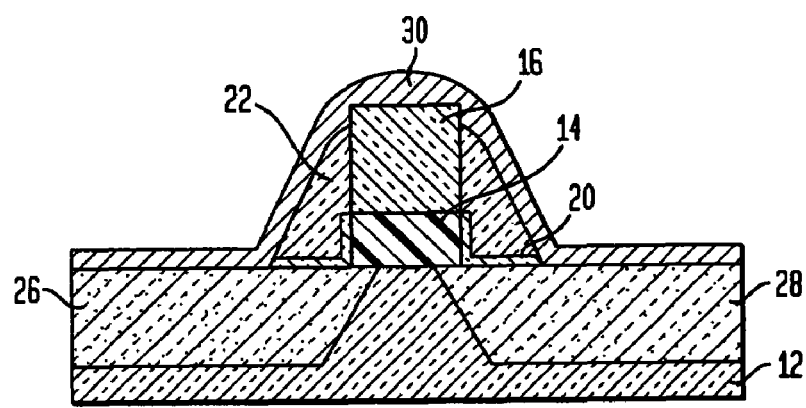
Figure 1I:
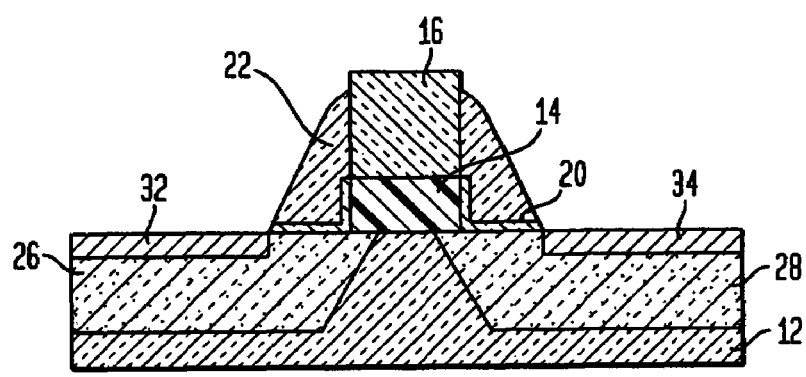

In FIGS. 1H and 1I, surface metal silicide layers 32 and 34 (i.e., source and drain silicide contacts) are then formed in the source and drain regions 26 and 28, by using a salicide process which includes the steps of depositing a silicide metal layer 30 over the entire structure including the source/drain regions, optionally depositing an oxygen diffusion barrier material such as TiN (not shown) on the silicide metal layer 30, first annealing to form surface metal silicide layers 32 and 34 in the source and drain regions, selective etching any non-reacted metal 30 and, if needed, performing a second annealing step.

The silicide metal used in forming the source/drain surface metal silicide layers 32 and 34 comprises any metal that is capable of reacting with silicon to form a metal silicide. Examples of such metals include, but are not limited to: Ti, Ta, W, Co, Ni, Pt, Pd, Ru, Re, Ge and alloys thereof. In one embodiment, Co is a preferred metal. In such an embodiment, the second annealing step is required. In another embodiment, Ni or Pt is preferred. In this embodiment, the second annealing step is typically not performed.

The metal used in forming the source/drain surface metal silicide layers 32 and 34 may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The annealing steps are preferably carried out in a gas atmosphere, e.g., He, Ar, $N_2$ or forming gas. They may be carried out in different atmospheres or in the same atmosphere. For example, He may be used in both annealing steps, or He can be used in the first annealing step and a forming gas may be used in the second annealing step.

The surface metal silicide layers 32 and 34 formed utilizing the above-mentioned process preferably have a thickness (measured vertically) of less than 500 Å, with a thickness from about 150 to about 300 Å being more typical.

When the semiconductor substrate does not comprise silicon, a layer of silicon (not shown) can be grown atop the exposed surface of the semiconductor substrate 12 and can be used in forming the source/drain surface metal silicide layers 32 and 34.

Figure 1J:
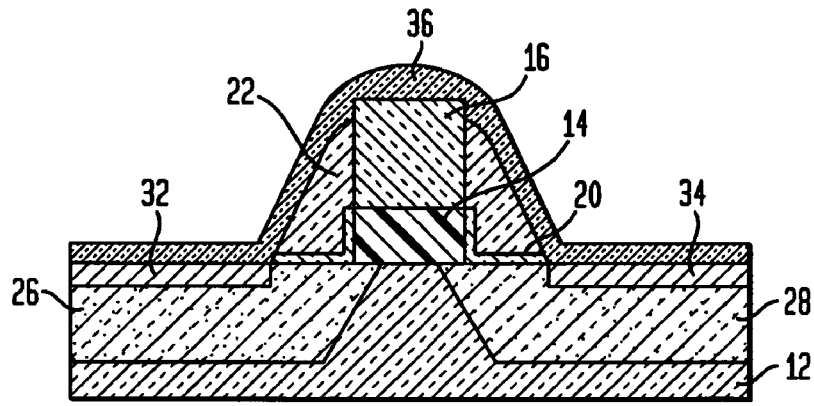
Figure 1K:
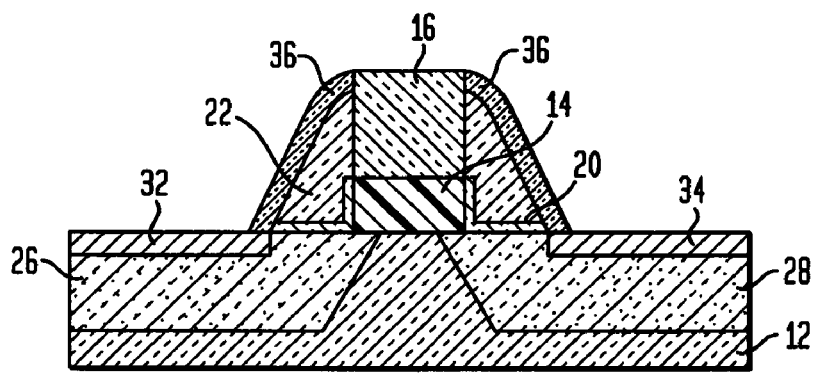

Next, a second conformal silicon nitride layer 36 is deposited over the entire structure, as shown in FIG. 1J, which is then patterned to form an additional set of spacers 36 along sidewalls of the first set of sidewall spacers 22 and to expose the dielectric hard mask 16, as shown in FIG. 1K.

This additional set of spacers 36 covers the interface between the source/drain metal silicide layers 32 and 34 and unreacted silicon in the source and drain regions 26 and 28 underneath the first set of spacers 22, and they will effectively prevent future reaction of the unreacted silicon with other silicide metal during the gate salicidation process (to be subsequently conducted).

Figure 1L:
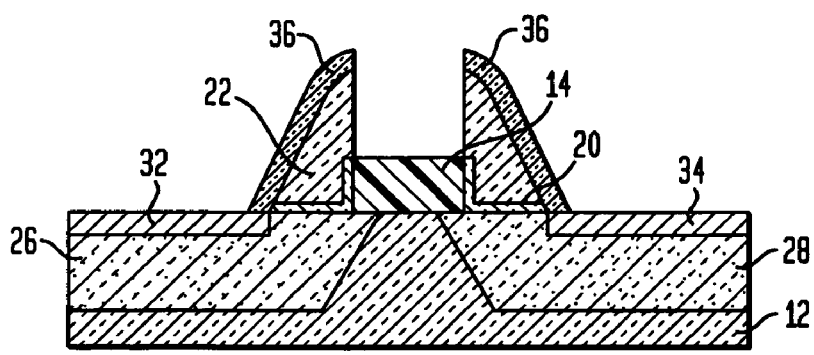

Next, and as shown in FIG. 1L, the dielectric hard mask 16 is removed, so that the underlying polysilicon gate conductor in the polysilicon gate stack layer 14 is exposed. During the removal of the dielectric hard mask 16 from atop the polysilicon gate conductor, a surface portion of the isolation region (not shown) may also be removed so as to provide an isolation region having a recessed surface.

The dielectric hard mask 16 is removed in the present invention by utilizing an etching process, wet or dry, which selectively removes the dielectric mask 16 from the structure. Although a dry etching process such as reactive-ion etching (RIE), ion beam etching (IBE), and plasma etching can be employed, it is preferred that a wet etch process be employed in selectively removing the dielectric hard mask 16 without removing much of the surface metal silicide layers 32 and 34 in the source/drain regions 26 and 28. An example of a wet etch process that can be used to selectively remove the dielectric hard mask 16 includes dilute hydrofluoric acid (DHF) mixed with at least one additive which selectively adsorbs onto the source/drain surface metal silicide layers 32 and 34, but not to the dielectric hard mask 16. This selective adsorption of the additives is achieved by exploiting the difference in the electro-kinetic behavior of the source/drain surface metal silicide layers 32 and 34 and the dielectric mask 16 in the DHF solution. As the additives form a very thin adsorbed layer (~2-5 nm) at the source/drain surface metal silicide layers 32 and 34, that region would experience an almost negligible etch rate, whereas the dielectric hard mask 16 will be etched at rates similar to DHF only solutions. Also, instead of mixing the additives to the DHF solution, the same effect may also be realized by exposing the surfaces to aqueous or inaqueous solutions with the above said additives and then etching in DHF solution. Examples of additive that can be employed during the selective etching process include, but are not limited to: any organic and inorganic compounds that would selectively adsorb onto the source/drain surface metal silicide layers 32 and 34 and not the dielectric mask 16, in general, and all amphoteric molecules such as surfactants and polymers in specific.

Figure 1M:
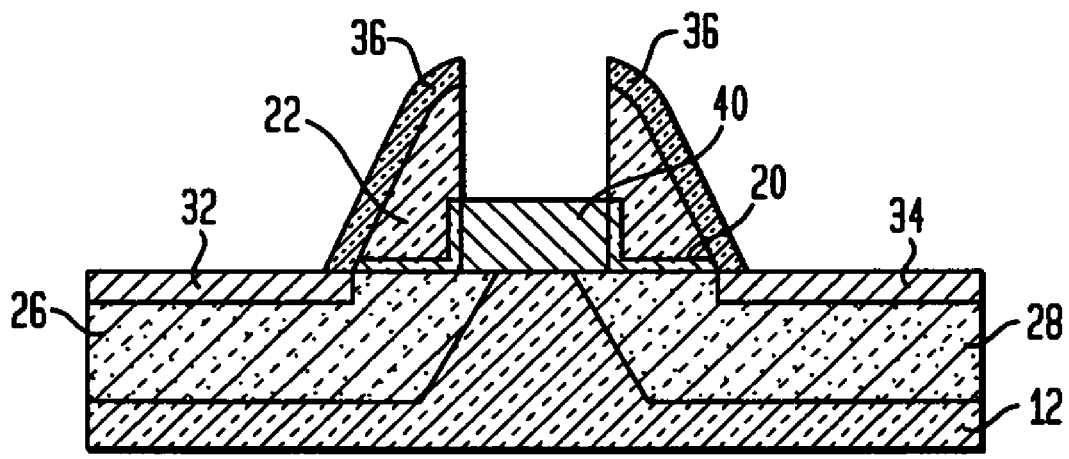

After etching the dielectric hard mask 16 from atop the poly Si gate conductor in the polysilicon gate stack layer 14, a second salicidation process (i.e., gate salicidation process) is then performed to consume the poly Si conductor, thereby forming a fully silicided metal gate 40, as shown in FIG. 1M. The first step of the second silicide process includes depositing a blanket gate silicide metal (not shown) atop the structure shown in FIG. 1L. The gate silicide metal can be deposited using one of the deposition processes mentioned above in depositing the metal used in formation of the source/drain surface metal silicide layers 32 and 34. The gate silicide metal can be the same or different than the metal used in forming the source/drain surface metal silicide layers 32 and 34.

The gate silicide metal can be composed of Ti, Hf, Ta, W, Co, Ni, Pt, Pd, Re, Ru, Ge or alloys thereof. In one embodiment, the gate silicide metal comprises Co. The resulting gate metal silicide, i.e., $CoSi_2$, is formed using a two-step annealing process, the first of which forms CoSi of higher resistivity and the second of which forms $CoSi_2$ of lower resistivity. In another embodiment of the present invention, the gate silicide metal comprises Ni or Pt, and the resulting gate metal silicide, i.e., NiSi or PtSi, can be formed using a single annealing step.

Thickness of the gate silicide metal layer is selected so as to form the silicide phase with the appropriate workfunction for the particular MOS device and to consume all of the silicon in the polySi gate conductor. For example, NiSi has a workfunction of 4.65 eV, and if the initial polysilicon height is 50 nm, the amount of Ni needed is about 27 nm. $CoSi_2$ has a workfunction of 4.45 eV, and if the initial polysilicon height is 50 nm, the amount of Co needed is about 14 nm. Although the thickness of the gate silicide metal layer given herein is the amount necessary to just consume the polySi gate conductor, it is preferred if the thickness were in excess by about 10% to make sure consumption is complete.

In some embodiments (not shown), an oxygen diffusion barrier such as TiN or W can be formed atop the gate silicide metal layer.

After deposition of the gate silicide metal layer, a first annealing step is employed to form a first silicide phase in the structure; the first silicide phase may or may not represent the lowest resistivity phase of a metal silicide. The first anneal is performed utilizing the ambients and temperatures described above in forming the source/drain surface metal silicide layers 32 and 34. Next, a selective wet etch step is employed to remove any non-reactive gate silicide metal from the structure.

For some metal silicides, the salicide process may be stopped at this point since the polysilicon is consumed and the resistivity of the first silicide phase is close to minimum values for the phase. This is in the case for Ni and Pt. In other cases, for example when Co or Ti are used as the silicide metal, a second higher temperature anneal (as described above) is needed for the consumption of the remaining polysilicon and forming a second silicide phase material. In this embodiment, the first silicide phase is a high resistivity phase silicide material, while the second silicide phase material is a lower resistivity phase silicide material.

The resulting semiconductor device structure therefore contains a fully silicided metal gate 40 and source/drain surface metal silicide layers 32 and 34, which are formed by two separate and independent salicidation processing steps and which can therefore have significantly different thickness and/or composition.

In one embodiment of the present invention, the fully silicided metal gate 40 can be significantly thicker than the corresponding source/drain surface metal silicide layers 32 and 34. Typically, the source/drain surface metal silicide layers 32 and 34 have a thickness that is less than 500 Å, while the fully silicided metal gate 40 has a thickness that is greater than 500 Å. In a preferred embodiment, the source/drain surface metal silicide layers 32 and 34 have a thickness that is less than 300 Å, while the fully silicided metal gate 40 has a thickness that is greater than 500 Å. In yet another preferred embodiment, the source/drain surface metal silicide layers 32 and 34 have a thickness that is less than 200 Å, while the fully silicided metal gate 40 has a thickness that is greater than 500 Å.

In a preferred embodiment, the source/drain surface metal silicide layers 32 and 34 comprise $CoSi_2$ and the fully silicided metal gates 40 comprise NiSi or NiPtSi. The metal used in forming the source/drain surface metal silicide layers 32 and 34 and the silicided metal gate 40 may include an alloying additive that can enhance the formation of the metal silicide. Examples of alloying additives that can be employed in the present invention include, but are not limited to: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the material used in forming the silicide. When present, the alloying additive is present in an amount from about 0.1 to about 50 atomic percent. The alloying additive may be introduced as a dopant material to the silicide metal layer or it can be a layer that is formed atop the silicide metal layer prior to annealing.

Because the interface between the metal silicide 32 and unreacted silicon in the source and drain regions underneath the first set of spacers 22 is completely covered by the additional set of spacers 36, the gate silicide metal cannot react with unreacted silicon in the source and drain regions underneath the first set of spacers 22 during the gate salicidation process. Therefore, undesirable additional metal silicide structures cannot be formed in the source and drain regions 26 and 28.

Figure 2:
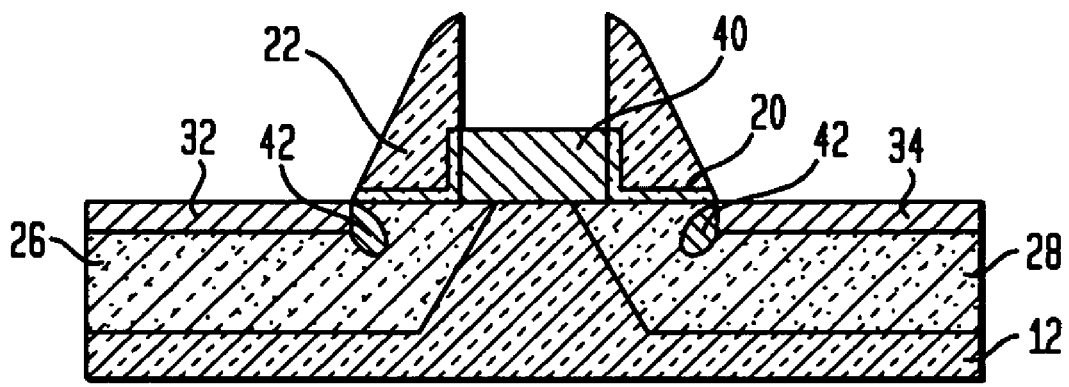
FIG. 2 shows an MOS device fabricated with metal silicide "spikes" in the source and drain regions, in addition to the source/drain surface metal silicide layers.

In contrast, if the additional set of spacers 36 was not provided, the gate silicide metal would react with silicon in the source and drain regions during the gate salicidation process to form undesirable metal silicide "spikes" 42 in the source and drain regions 26 and 28, as shown in FIG. 2.

FIGS. 3A-3G shows an alternative method in which two additional sets of spacers are provided after source/drain metal silicide formation and before the gate silicide formation, which further reduces the risk of forming deleterious metal silicide structures in the source and drain regions.

Figure 3A:
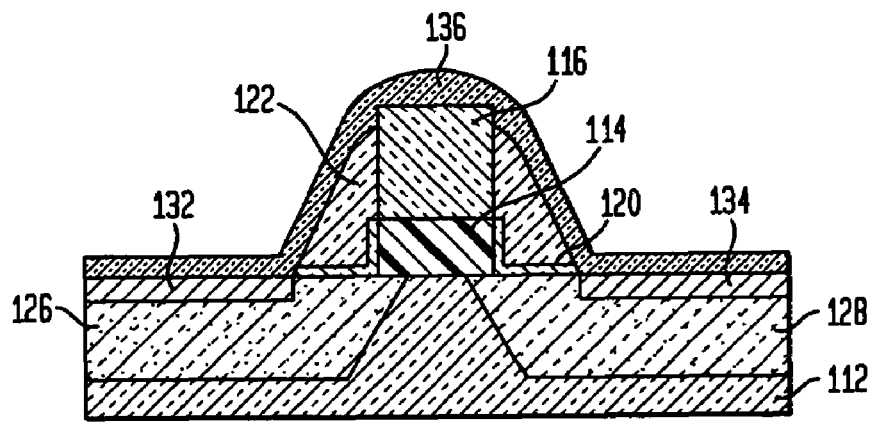
FIGS. 3A-3G illustrates the processing steps for fabricating another MOS device with independently formed silicided metal gate and source/drain surface metal silicide layers, according to one embodiment of the present invention, while the source and drain regions are devoid of other metal silicide structures besides the surface metal silicide layers.

Specifically, FIG. 3A shows a partially completed semiconductor structure similar to that shown in FIG. 1J. Specifically, such semiconductor structure comprises a semiconductor substrate 112 having a patterned polysilicon gate stack layer 114 with an overlaying dielectric hard mask 116 and abutting source/drain regions 126 and 128 with surface metal silicide layers 132 and 134. Sidewalls of the patterned polysilicon gate stack layer 114 are protected by a silicon oxide sidewall layer 120 and a first set of sidewall spacer structures 122. A conformal silicon nitride layer 136 is deposited over the entire structure, as shown in FIG. 3A, for subsequent formation of additional sidewall spacer structures.

Figure 3B:
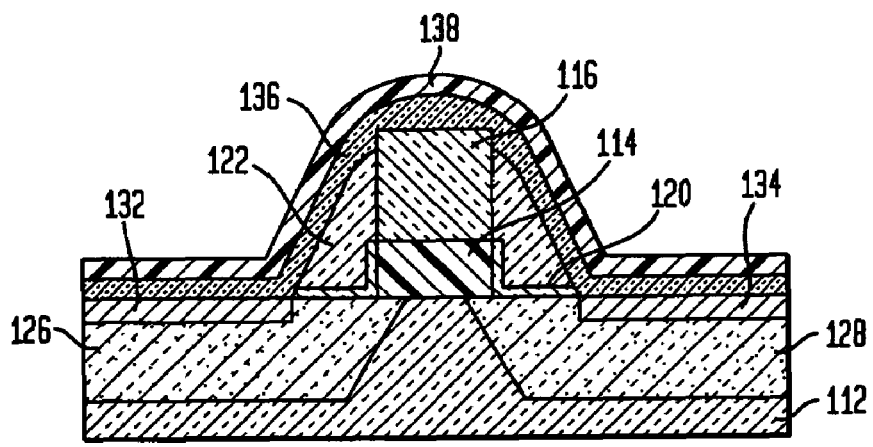
Figure 3C:
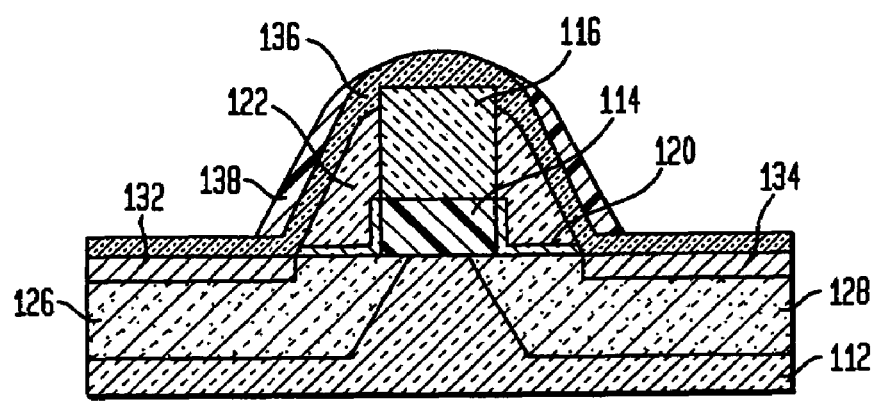
Figure 3D:
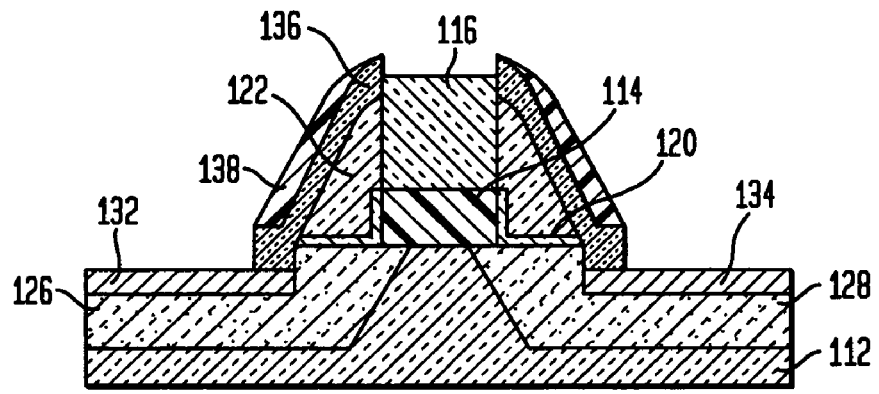

A masking layer 138 is deposited atop the silicon nitride layer 136, as shown in FIG. 3B, which is then patterned to form a first additional set of spacers 138, as shown in FIG. 3C. Examples of the masking layer 138 include, but are not limited to: a photoresist or an anti-reflection coating layer. Such a masking layer 138 can be readily patterned by conventional techniques such as RIE to form spacers 138, which serve as masks during formation of silicon nitride spacer structures 136 along sidewalls of the first set of sidewall spacers 122, while the dielectric hard mask 116 is exposed, as shown in FIG. 3D. The silicon nitride spacer structures 136 so formed have a "Ω" shape with flanking side sections.

Figure 3E:
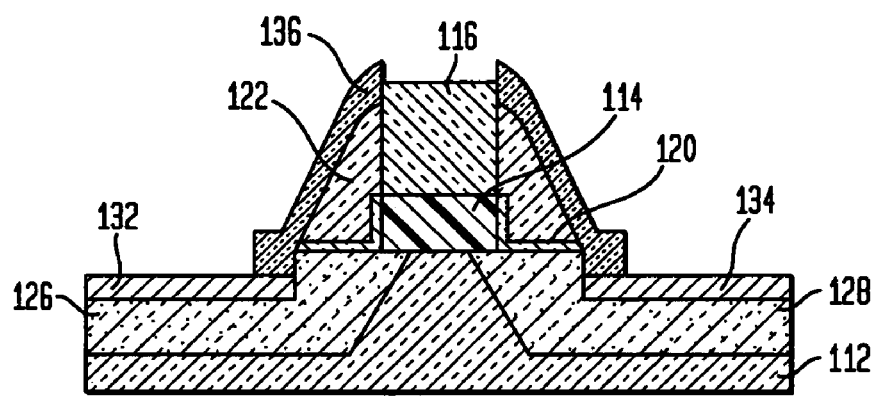

After formation of the silicon nitride spacer structures 136, the spacers 138 formed by the masking layer can be removed by a conventional stripping process, as shown in FIG. 3E.

Figure 3F:
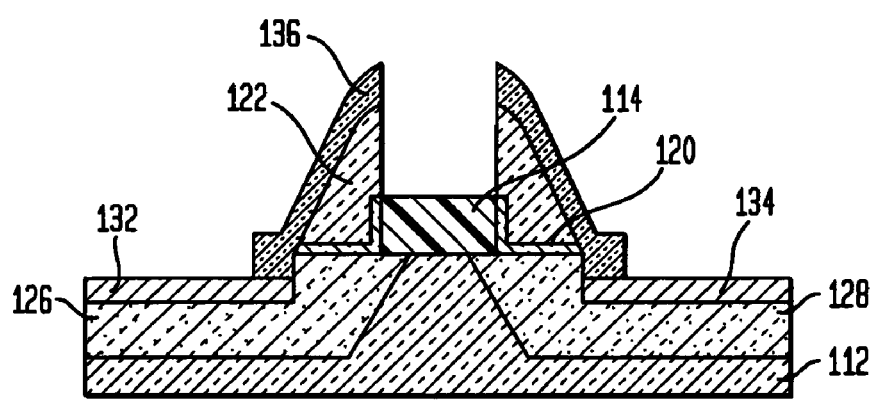
Figure 3G:
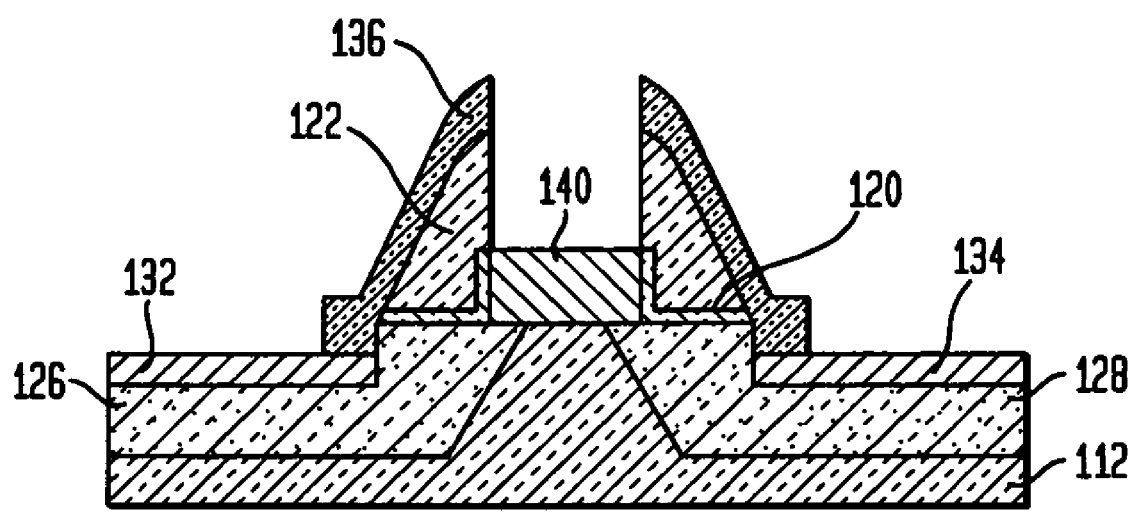

Next, and as shown in FIG. 3F, the dielectric hard mask 116 is removed, so that the underlying polysilicon gate conductor in the polysilicon gate stack layer 114 is exposed, and a subsequent gate salicidation process is carried out to convert the polysilicon gate conductor into a fully silicide metal gate 140, as shown in FIG. 3G.

During the gate salicidation process, the "Ω"-shaped silicon nitride spacer structures 136 and the flanking side sections function to more effectively cover the interface between the source/drain surface metal silicide layers 132 and 134 and unreacted silicon in the source and drain regions 126 and 128 underneath the first set of spacers 122 and to prevent formation of undesirable additional metal silicide structures in the source/drain regions 126 and 128.

After completion of the inventive metal silicide gate processing mentioned above, the conventional approach for building a multilayer interconnect structure for transistor to transistor and transistor to external contacts can be employed.

It should be noted that although the above describes an initial structure that does not include raised source/drain regions, the present invention also contemplates the presence of raised source/drain regions in the initial structure. The raised source/drain regions are formed utilizing conventional techniques well known to those skilled in the art. Specifically, the raised source/drain regions are formed by depositing any Si-containing layer, such as epi Si, amorphous Si, SiGe, and the like, atop the substrate 12 or 112 prior to implanting.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a semiconductor device structure having a fully silicide metal gate, comprising:
    providing a precursor structure that comprises at least one patterned gate stack with an overlaying dielectric mask and a first set of sidewall spacer structures, and abutting source and drain regions with surface metal silicide layers, wherein said at least one patterned gate stack comprises a polysilicon gate conductor on a gate dielectric layer;
    forming a first additional set of spacer structures alongside of the first set of sidewall spacer structures and forming a second additional set of spacer structures alongside the first additional set of spacer structures, wherein a portion of said first and second additional sets of spacers is located directly on said surface metal silicide layers to protect an interface between the surface metal silicide layers and said source and drain regions;
    removing the overlaying dielectric mask to expose the polysilicon gate conductor; and
    converting the polysilicon gate conductor into a fully silicided metal gate.

2. The method of claim 1, wherein said fully silicided metal gate is thicker than the surface metal silicide layers of the abutting source and drain regions.

3. The method of claim 2, wherein the fully silicided metal gate has a thickness that is greater than 500 Å, and wherein the surface metal silicide layers of the abutting source and drain regions each have a thickness that is less than 500 Å.

4. The method of claim 2, wherein the fully silicided metal gate has a thickness that is greater than 500 Å, and wherein the surface metal silicide layers of the abutting source and drain regions each have a thickness that is less than 300 Å.

5. The method of claim 1, wherein the fully silicided metal gate and the surface metal silicide layers of the source and drain regions comprise the same or different metal silicide material(s).

6. The method of claim 5, wherein the metal silicide material(s) are silicides of Ti, Ta, W, Co, Ni, Pt, Pd, Re, Ru, Ge or alloys thereof.

7. The method of claim 5, wherein the metal silicide material(s) are silicides of Co, Ni, Pt, or alloys thereof.

8. The method of claim 1, wherein the surface metal silicide layers of the abutting source and drain regions comprise a first metal silicide material, and wherein said fully silicided metal gate comprises a second, different metal silicide material.

9. The method of claim 8, wherein the first metal silicide material comprises $CoSi_2$, and wherein the second metal silicide material comprises NiSi or NiPtSi.

10. The method of claim 1, wherein the surface metal silicide layers of the source and drain regions are formed by utilizing a first salicidation process that comprises: forming a metal layer comprising at least one metal that can react with silicon to form a metal silicide, first annealing to form the metal silicide in a first silicide phase, selectively etching non-reacted metal, and optionally performing a second annealing to convert the metal silicide in the first silicide phase into a second silicide phase having lower resistivity than the first silicide phase.

11. The method of claim 10, wherein the first annealing is performed at an annealing temperature ranging from about 300° C. to about 600° C.

12. The method of claim 10, wherein the optional second annealing is performed at an annealing temperature ranging from about 600° C. to about 800° C.

13. The method of claim 10, wherein the polysilicon gate conductor is converted into the fully silicided metal gate by depositing over the polysilicon gate conductor a metal layer comprising at least one metal that can react with silicon to form a metal silicide, first annealing to form the metal silicide in a first silicide phase, selectively etching non-reacted metal, and optionally performing a second annealing to convert the metal silicide in the first silicide phase into a second silicide phase having lower resistivity than the first silicide phase.

14. The method of claim 13, wherein the first annealing is performed at an annealing temperature ranging from about 300° C. to about 600° C.

15. The method of claim 13, wherein the optional second annealing is performed at an annealing temperature ranging from about 600° C. to about 800° C.

* * * * *